United States Patent [19]

Yokoyama et al.

[11] Patent Number: 4,979,146
[45] Date of Patent: Dec. 18, 1990

[54] ELECTRICALLY ERASABLE NON-VOLATILE SEMICONDUCTOR DEVICE

[75] Inventors: Sadayuki Yokoyama, Kawasaki; Masamichi Asano, Tokyo; Hiroshi Iwahashi, Yokohama; Kaoru Nakagawa, Yokohama, all of Japan

[73] Assignee: Kabushiki Kaisha Toshiba, Kawasaki, Japan

[21] Appl. No.: 302,712

[22] Filed: Jan. 27, 1989

[30] Foreign Application Priority Data

Jan. 28, 1988 [JP] Japan .................................. 63-18264

[51] Int. Cl.$^5$ ........................ G11C 11/34; H01L 23/48
[52] U.S. Cl. ..................................... 365/185; 365/218; 357/23.5
[58] Field of Search ....................... 365/182, 185, 218; 357/23.5

[56] References Cited

U.S. PATENT DOCUMENTS 4,466,081  8/1984  Masuoka ............................. 365/218
4,597,062  6/1986  Asano et al. ........................ 365/201

*Primary Examiner*—Joseph A. Popek
*Attorney, Agent, or Firm*—Finnegan, Henderson, Farabow, Garrett, and Dunner

[57] ABSTRACT

In an electrically erasable non-volatile semiconductor memory device, a plurality of non-volatile semiconductor memory cells are arranged in a matrix form and are connected to corresponding ones of row and column lines. In a data writing mode, a first voltage Vp at is applied to the column lines so that the drains of the memory cells are maintained at a drain potential, and a second voltage is applied to the row lines so that a sum level of the drain potential and the threshold voltage of the memory cell is not smaller than the floating gate potential of the memory cell.

10 Claims, 3 Drawing Sheets

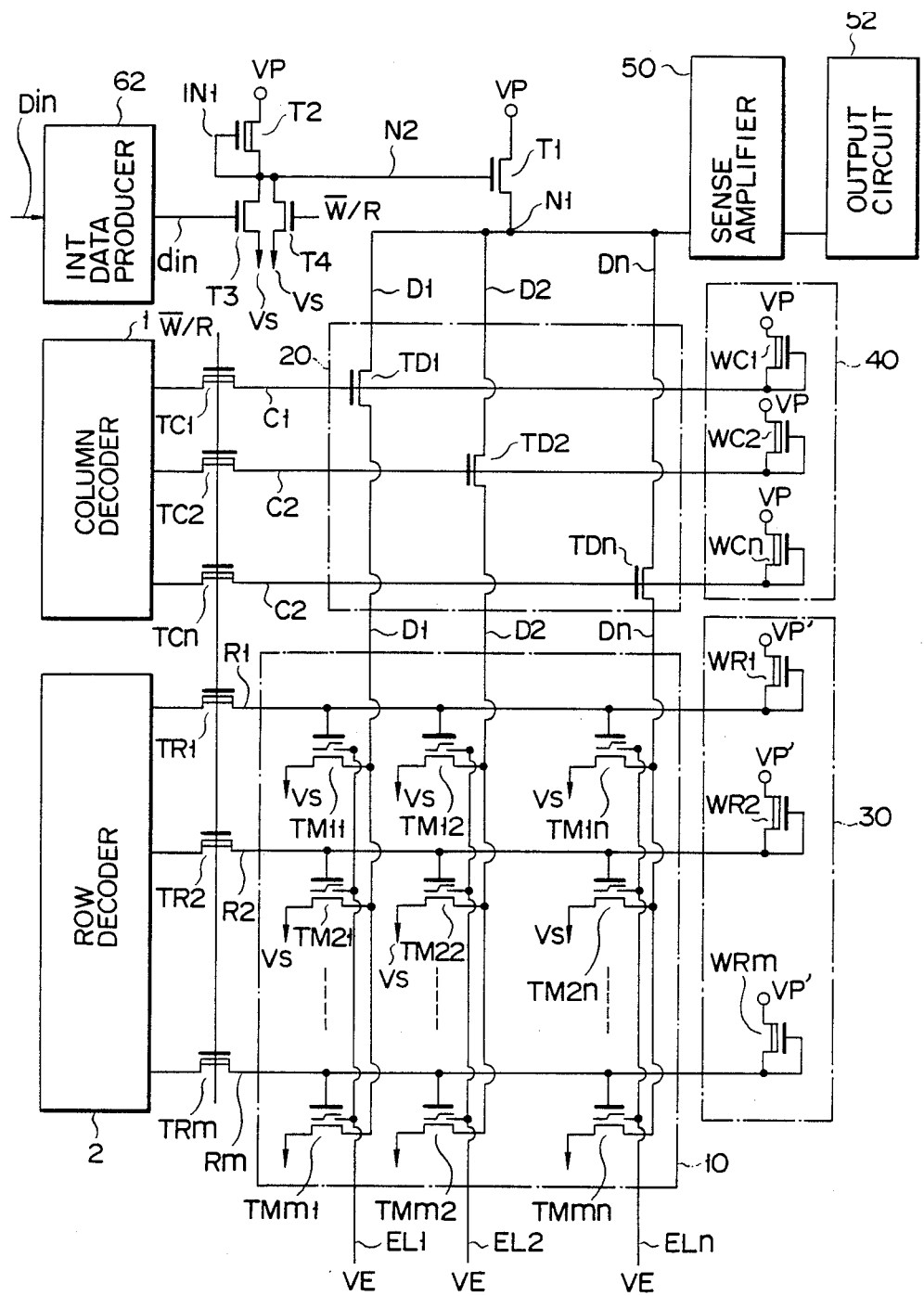
F I G. 4

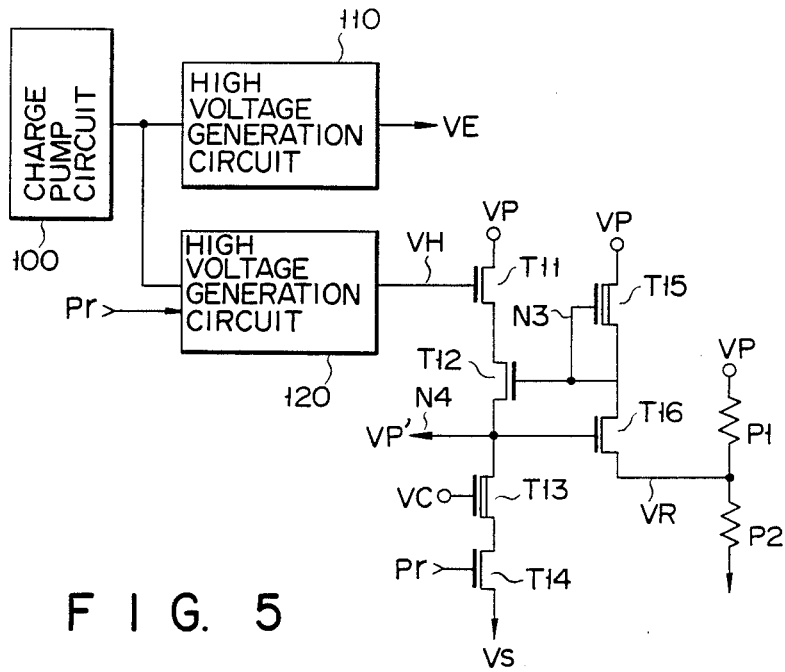
F I G. 5
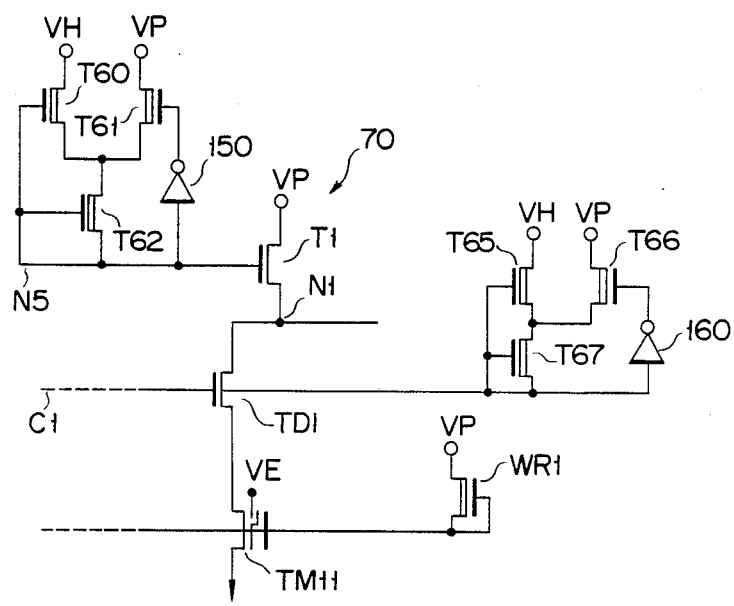
F I G. 6

ELECTRICALLY ERASABLE NON-VOLATILE SEMICONDUCTOR DEVICE

BACKGROUND OF THE INVENTION

1. Field of the Invention

This invention relates to a memory device in which non-volatile semiconductor memory cells ar arranged, and more particularly to a memory device in which electrically erasable non-volatile semiconductor memory cells are arranged.

2. Description of the Related Art

The programming operation in the electrically erasable programmable ROM (EEPROM) is effected in substantially the same manner as in the erasable programmable ROM (EPROM) That is, in the programming mode, high voltages are applied to the control gate and the drain of the floating gate type MOSFET to form a strong electric field, causing hot electrons to be generated in the substrate near the drain region. The electrons are injected into the floating gate via the insulating film to change the threshold voltage. In this way, data is programmed into the floating gate type MOSFET. In the erasing mode, a high voltage of 30 V, for example, is applied to the erasing gate of the floating gate type MOSFET to emit the electrons which have been injected into the floating gate, and thus data can be erased.

FIG. 1A is a plan view of a memory cell of the EEPROM having the triple gate structure, and FIG. 1B is a sectional view taken along the I—I line of FIG. 1A. In FIGS. 1A and 1B, CG denotes a control gate, FG a floating gate, EG an erasing gate, S a source and D a drain. The MOS transistor having the triple gate structure is indicated by a symbol shown in FIG. 2A, and the MOS transistor can be represented by an equivalent circuit using coupling capacitors as shown in FIG. 2B. As shown in FIG. 2B, capacitor Ccf is connected between control gate CG and floating gate FG, capacitor Csub is connected between floating gate FG and substrate Sub, capacitor Cdf is connected between drain D and floating gate FG, and capacitor Cef is connected between erasing gate EG and floating gate FG. Assume that charge Qi is injected into floating gate FG in the initial condition of the MOS transistor. Then, charge Qi can be expressed by the following equation:

$$\begin{aligned} Qi &= (Vfg - Vcg)Cef + (Vfg - Vsub)Csub + \\ &\quad (Vfg - Veg)Cef + (Vfg - Vd)Cdf \\ &= Vfg(Ccf + Csub + Cef + Cdf) - \\ &\quad (Veg \cdot Ccf + Vsub \cdot Csub + Veg \cdot Cef + Vd \cdot Cdf) \end{aligned}$$

where Vcg, Vfg, Veg, Vsub and Vd respectively indicate voltages applied to control gate CG, floating aate FG, erasing gate EG, substrate Sub and drain D.

Assume that $Ccf + Csub + Cef + Cdf = Ct$. Then, voltage Vfg of floating gate FG can be expressed as follows:

$$Vfg = \frac{Vfg \cdot Ccs + Vsub \cdot Csub + Veg \cdot Cef + Vd \cdot Cdf + Qi}{Ct} \quad (1)$$

Since, in general, Vsub=0 V and Cef, Cdf $<<$ Ccf equation (1) can be re-written as follows:

$$Vfg = \frac{Vcg \cdot Ccf}{Ct} + Vfgi \quad (2)$$

where Vfgi=Qi/Ct.

FIG. 3A is a characteristic diagram showing the relation between variation ΔVth in the threshold voltage and programming time Tpw required for programming data into the MOS transistor having the triple gate structure shown in FIG. 2A with control gate voltage Vcg used as a parameter and with drain voltage Vd kept at a constant value. In FIG. 3A, broken line I indicates a characteristic obtained in a case where control gate voltage Vcg is set to be relatively high and solid line II indicates a characteristic obtained in a case where control gate voltage Vcg is set to be relatively low. FIG. 3B is a characteristic diagram showing the relation between control voltage Vcg and variation ΔVth in the threshold voltage in a case where data is programmed into the MOS transistor with drain voltage Vd and programming time Tpw kept constant.

In general, the operation of programming data into the EPROM having a memory cell formed of a MOS transistor with the double gate structure is different from the operation of programming data into the EEPROM having a memory cell formed of a MOS transistor with the triple gate structure in the following point. That is, in the former data programming operation, the larger amount of electrons can be injected into floating gate FG to attain a better programming characteristic as control gate voltage Vcg applied to control gate CG is set to a higher voltage level as is disclosed in U.S. Pat. No. 4,597,062. In contrast, as shown in FIGS. 3A and 3B, in the latter data programming operation, variation ΔVth in tee threshold voltage becomes small when control gate voltage Vcg exceeds a certain voltage level, lowering the programming characteristic.

The above program may occur based on the following fact. In the EEPROM cell, floating gate FG will be positively charged after the electrons trapped in floating gate FG are removed and data is erased. In the programming mode in which data is programmed again, the potential of floating gate FG becomes too high to form an inversion layer in the substrate directly under floating gate FG when voltage Vcg applied to control gate CG exceeds a certain voltage level. As a result, it becomes difficult to concentrate the electric field in the pinch-off region in the substrate near drain D. For example, unlike the EEPROM, in the EPROM, floating gate voltage Vfg is set to be approx. 12 V based on equation (2) if Cef/Ct=0.57 and when drain voltage Vd=15 V is applied to drain D and control gate voltage Vcg=21 V is applied to the control gate with floating gate voltage Vfgi kept at 0 V. As a result, the cell transistor is operated in the pentode operation mode and sufficiently large amount of hot electrons are generated in the pinch-off region of the substrate near the drain, causing the electrons to be efficiently injected into the floating gate. In contrast, in the EEPROM, the floating gate will be positively charged in a condition in which data is fully erased. For example, the floating gate is positively charged so that potential Vfgi may be set to +6 V. Even if drain voltage Vd=15 V is applied to the drain and control gate voltage Vcg=21 V is applied to the control gate in the same manner as in the case of the EPROM, the floating gate voltage will become as high as 18 V. If data is programmed into the memory cell in this condition, an inversion layer is formed in the substrate directly under the floating gate and the memory cell transistor will be operated in the triode operation mode. As a result, no pinch-off region is created in the memory cell transistor and a sufficiently large amount of hot electrons cannot be generated in the substrate, thus lowering the efficiency of injecting the hot electrons into the floating gate.

SUMMARY OF THE INVENTION

An object of this invention is to provide an electrically erasable non-volatile semiconductor memory device in which a sufficiently large amount of hot electrons can be injected into the floating gate of an EEPROM cell, thus attaining a good programming characteristic.

According to the invention, there is provided a non-volatile semiconductor memory device comprising a plurality of row and column lines, a memory cell array including a plurality of non-volatile semiconductor memory cells each having a source, drain, control gate, insulating film and floating gate buried in the insulating film, data being stored in the memory cell by injecting charges through the insulating film into the floating gate, the memory cells being arranged in a matrix array, the control gates of the memory cells being connected to the corresponding row lines, respectively and the drains of the memory cells being connected to the column lines, respectively, means for applying a first voltage to the column lines in a data writing mode, and means for applying a second voltage to the row lines in the data writing mode, the second voltage being set to have a predetermined level lower than that of the first voltage.

According to the invention, there is also provided a non-volatile semiconductor memory device comprising a plurality of row and column lines, a memory cell array including a plurality of non-volatile semiconductor memory cells each having a predetermined threshold voltage and a semiconductor structure including a source, drain, control gate, insulating film and floating gate buried in the insulating film, data being stored in the memory cell by injecting charges through the insulating film into the floating gate, the memory cells being arranged in a matrix array, the control gates of the memory cells being connected to the corresponding row lines, respectively, the drains of the memory cells being connected to the column lines, respectively, and the floating gates being maintained at a floating gate potential after data is erased from the memory cells, means for applying a first voltage to the column lines in a data writing mode so that the drains of the memory cells are maintained at a drain potential, the sum level of the drain potential and the threshold voltage being not smaller than the floating gate potential, and means for applying a second voltage to the row lines in the data writing mode.

BRIEF DESCRIPTION OF THE DRAWINGS

FIG. 4 shows an electrically erasable non-volatile semiconductor memory device according to one embodiment of this invention;

FIG. 5 shows an example of constant voltage generation circuit used in the semiconductor memory device of FIG. 4; and FIG. 6 shows an electrically erasable non-volatile semiconductor memory device according to another embodiment of this invention.

DETAILED DESCRIPTION OF THE PREFERRED EMBODIMENT

Figure 1A:
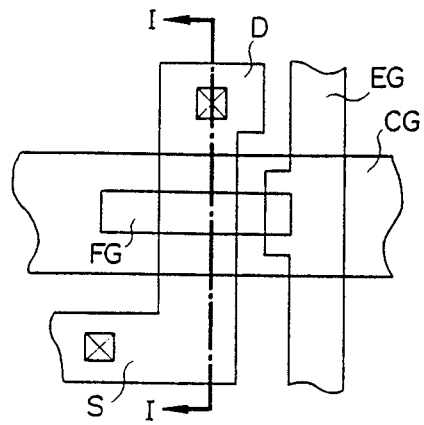
FIG. 1A is a plan view of a memory cell of the conventional EEPROM.
Figure 1B:
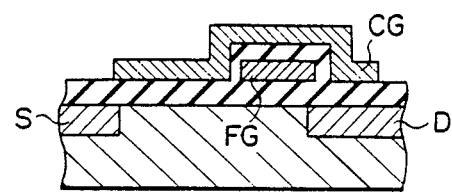
FIG. 1B is sectional view taken along line I—I of FIG. 1A.
Figure 2A:
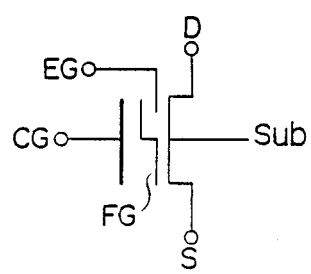
FIG. 2A shows a symbol representing a MOS transistor with the triple gate structure as shown in FIGS. 1A and 1B.
Figure 2B:
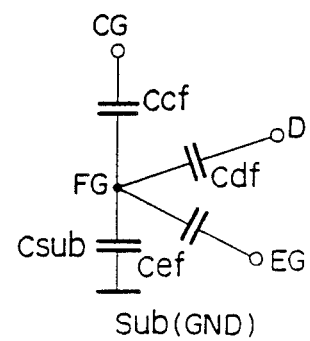
FIG. 2B shows an equivalent circuit of the MOS transistor shown in FIG. 2A represented by use of coupling capacitors.
Figure 3A:
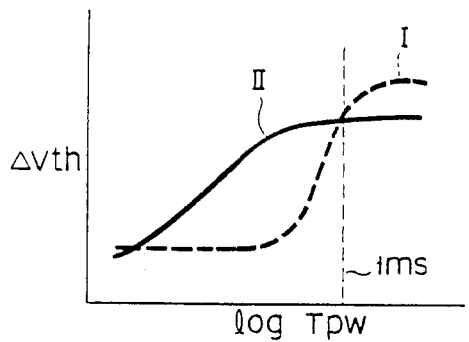
FIG. 3A is a characteristic diagram showing the relation between variation $\Delta V_{th}$ in the threshold voltage and programming time Tpw required for programming data with control gate voltage Vcg used as a parameter and with drain voltage Vd kept constant.
Figure 3B:
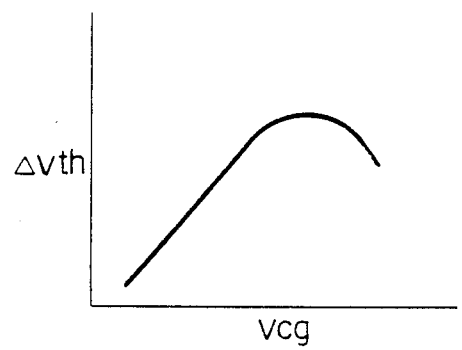
FIG. 3B is a characteristic diagram showing the relation between control voltage Vcg and variation $\Delta V_{th}$ in the threshold voltage in a case where data is programmed with drain voltage Vd and programming time Tpw kept constant.

FIG. 4 shows an electrically erasable non-volatile semiconductor memory device according to one embodiment of this invention. In FIG. 4, Rl to Rm denote row lines, Dl to Dn denote column lines, and memory cells TM11 to TMmn each having a MOS transistor with the triple gate structure are each arranged at a corresponding one of the intersecting positions between row lines Rl to Rm and column lines Dl to Dn. Those control gates of memory cells TMll to TMmn which lie on the same row are connected to a corresponding one of row lines Rl to Rm, and those drains of memory cells TMll to TMmn which lie on the same column are connected to a corresponding one of column lines Dl to Dn. Further, the sources of memory cells TMll to TMmn are connected to ground potential terminal V, and those erasing electrodes of memory cells TMll to TMmn which lie on the same column are connected to a corresponding one of erasing lines ELl to ELn to which erasing voltage VE is applied in the erasing mode. Thus, memory cells TMll to TMmn are arranged in a matrix form and selectively connected to row lines Rl to Rm, column lines Dl to Dn and ground potential terminal Vs to constitute memory cell array 10.

Column lines Dl to Dn are connected to signal detection node Nl via respective column selection enhancement type MOS transistors TDl to TDn of column selection circuit 20 for selecting the column lines. Signal detection node Nl is connected to sense amplifier 50, and therefore, in the readout mode, a signal on signal detection node Nl is sensed by sense amplifier 50 and the sensed signal is output via output circuit 52 to the exterior of the memory device. Enhancement type programming transistor Tl is connected between signal detection node Nl and a terminal to which programming voltage Vp of first external power source is applied, and the gate of transistor Tl is connected to an output node N2 to which a control signal is supplied from programming data control circuit 60. Data control circuit 60 includes internal data producer 62 for receiving external input data Din and converting the same into internal input data din, inverter INl connected between the terminal to which programming voltage Vp of first external power source is applied and ground potential terminal Vs, and enhancement type MOS transistor T4 which is connected between output node N2 and ground potential terminal Vs and whose gate is connected to receive a read/write signal $\overline{WR}$. Inverter IN1 includes depletion type MOS transistor T2 which is connected between the terminal to which programming voltage Vp of first external power source is applied and node N2 and whose gate is connected to node N2 and enhancement type MOS transistor T3 connected between output node N2 and ground potential terminal Vs and having a gate to which input data din is supplied.

The gates of column selection MOS transistors TD1 to TDn are respectively connected to column selection lines C1 to Cn which are selectively activated by column decoder 1. One end of each of column selection lines C1 to Cn is connected via depletion type MOS transistors TC1 to TCn to column decoder 1 which selects column selection lines C1 to Cn in response to an address signal. Row lines R1 to Rm are connected at one end to row decoder 2 for selecting row lines R1 to Rm in response to the address signal via depletion type MOS transistors TR1 to TRm. A read/write control signal $\overline{W/R}$ which is kept at a low level in the programming mode and at a high level in the readout mode is applied to the gates of MOS transistors TC1 to TCn and TR1 to TRm.

The other ends of row lines R1 to Rm selectively activated by row decoder 2 are connected to programming transistor circuit 30, and the other ends of column selection lines C1 to Cn are connected to programming transistor circuit 40. Transistor circuit 40 includes depletion type MOS transistors WC1 to WCn whose sources and gates are commonly connected to respective column selection lines C1 to Cn. Externally supplied first programming power source voltage VP is applied to the drains of transistors WC1 to WCn. Transistor circuit 30 includes depletion type MOS transistors WR1 to WRm whose sources and gates are commonly connected to respective row lines R1 to Rm. Second programming internal power source voltage VP' is applied to the drains of transistors WR1 to WRm. Second programming internal power source voltage VP' is set to be higher than voltage Vd applied to the drains of memory cells TM11 to TMmn and lower than externally supplied first programming power source voltage VP. In each of memory cells TM11 to TMmn, the sum of drain voltage applied to the drain thereof and threshold voltage of a corresponding one of memory cells TM11 to TMmn is set to be substantially equal to or larger than floating gate Vfg.

Now, circuit 70 for generating second programming internal power source voltage VP' is explained with reference to FIG. 5. Internal power source circuit 70 includes a constant voltage generation circuit operated on first programming power source voltage VP to generate constant voltage VP' which is lower than first programming power source voltage VP by a preset value.

The drain voltage of each memory cell is determined by current flowing from external power source voltage VP into the memory cell via transistors T1 and TD1 which are connected to node N1, for example. Assume now that external power source voltage VP=21 V. Then, the drain voltage becomes 15 V. In this case, if internal power source voltage VP' of 17.5 V is generated, floating gate voltage Vfg of 16 V can be derived based on equation (2), and the threshold voltage of the floating gate transistor is 1 V. Therefore, the memory cell is operated in the pentode operation mode, thus attaining a good programming characteristic.

When the memory device of FIG. 4 is set in the erasing mode, all of the row lines R1 to Rm and all of the column selection lines C1 to Cn are deselected. In this condition, erasing voltage VE is applied to one of erasing lines EL1 to ELn or all of the erasing lines EL1 to ELn simultanuously. Therefore, a high voltage of 27 V is applied to erasing electrode EG in a condition that control gate CG and drain D of that one of memory cells TM11 to TMmn which is to be erased are held in the electrically floating state and source S is kept at 0 V. As a result, electrons trapped in floating gate FG are emitted and discharged to erasing electrode EG. At this time, floating gate FG is positively charged to decrease the threshold voltage of the memory cell, thus erasing data.

In the programming mode, external source voltage VP is set at a high voltage of 21 V and transistor T1 is turned on by external power source voltage VP applied to node N2. Further, read/write control signal $\overline{W/R}$ of low level is supplied to the gates of MOS transistors TC1 to TCn and TR1 to TRm. Thus, one of column lines C1 to Cn and one of row lines R1 to Rm are selected by means of column decoder 1 and row decoder 2, respectively. A corresponding one of MOS transistors TD1 to TDn whose gate is connected to a selected one of column lines C1 to Cn is turned on by power source voltage Vp from transistor circuit 40. In contrast, since those of MOS transistors TC1 to TCn which are connected to non-selected ones of column lines C1 to Cn are set in the conductive state, those of MOS transistors TD1 to TDn whose gates are connected to non-selected ones of column lines C1 to Cn are kept in the off condition. As a result, power source voltage Vp is applied to those of column lines D1 to Dn which are connected to the turned-on ones of MOS transistors TD1 to TDn, and thus power source voltage Vp is applied to the drains of corresponding ones of memory cells TM11 to TMmn. Likewise, power source voltage Vp' is applied from transistor circuit 30 to a corresponding one of memory cells TM11 to TMmn whose gate is connected to a selected one of row lines R1 to Rm. At this time, since those of MOS transistors TR1 to TRn which are connected to non-selected ones of row lines R1 to Rm are set in the conductive state, the gates of those of memory cells TM11 to TMmn which are connected to non-selected ones of row lines R1 to Rm are kept at a low potential level Power source voltage Vp is applied to the drain of the memory cell in which data is to be programmed and power source voltage Vp' is applied to the gate thereof to inject electrons into the floating gate, thus programming data.

In the readout mode, data is read out by the same readout operation as in the normal memory device. The detail explanation of the operation of the readout mode is disclosed in U.S. Pat. No. 4,597,062 (by Asano et al).

FIG. 5 shows an example of the detail construction of a circuit for generating internal power source voltage VP'. In the circuit of FIG. 5, a pulse signal generated from charge pump circuit 100 is supplied to high voltage generation circuits 110 and 120 of the normal bootstrap type. Stepped-up erasing voltage VE is generated as an erasing gate signal from high voltage generation circuit 110 and erasing voltage VE is supplied to the erasing line. Further, stepped-up programming voltage is generated as a programming signal from high voltage generation circuit 120

Stepped-up voltage VH is applied to the gate of enhancement type MOS transistor T11 whose drain is connected to a terminal to which voltage VP is applied Enhancement type MOS transistor T11 is connected in series with enhancement type MOS transistor T12 whose source is connected to node N4 at which internal power source voltage VP' of constant voltage level is generated. The gate of transistor T12 is connected to node N3, and the gate and source of depletion type MOS transistor T15 having a drain connected to the terminal to which external power source voltage VP is applied and the drain of enhancement type MOS transistor T16 of relatively low threshold voltage are connected to node N3. The source of transistor T16 is connected to a connection node between resistors P1 and P2 and the gate thereof is connected to node N4. Divided voltage VR obtained by dividing a voltage between external power source voltage VP and the ground potential by means of resistors P1 and P2 is applied to the source of transistor T16. Further, the drain of depletion type MOS transistor T13 which is set in the conductive state by externally supplied power source voltage VC applied to the gate thereof and functions as a buffer with respect to variation in the potential at node N4 is connected to connection node N4. Enhancement type MOS transistor T14 is connected between the source of transistor T13 and the terminal to which ground potential Vs is applied, and programming control signal Pr is supplied to the gate thereof.

With the constant voltage circuit of the above arrangement, signal Pr is set at a high level in the data readout mode, and output VH of high voltage generating circuit 120 is changed to a low level in response to signal Pr of high level. At the same time, MOS transistor T14 is turned on in response to signal Pr of high level. Thus, node N4 is connected to ground potential terminal Vs via MOS transistors T13 and T14

In contrast, in the data programming mode, since signal Pr is set at a low level and external power source voltage VP is set to 21 V, MOS transistor T14 is turned off and output voltage VH of high voltage generating circuit 120 is changed to voltage level (VP+α). As a result, MOS transistor T11 is operated in the triode mode, and in this case, potential VP' of node N4 can be expressed as follows $$VP' = Vn - Vth12 = VR + Vth16$$

where Vn is a potential at node N3, Vth12 is the threshold voltage of MOS transistor T12, and Vth16 is the threshold voltage of MOS transistor T16. Assume that Vth16 is about 1.5 V and external power source voltage VP is 21 V. Then, internal power source voltage VP' is set to 17.5 V when divided voltage VR is set to 16 V.

If thus generated internal power source voltage VP' is applied to transistor circuit 30 shown in FIG. 4, the potential of row lines R1 to Rn connected to the drains of the memory cells can be set to be lower than the potential of column lines D1 to Dn connected to the drains of the memory cells, thus making it possible to operate the memory cell in the pentode operation mode in the programming mode. As a result, the programming characteristic can be improved.

FIG. 6 shows a second embodiment of this invention. The basic structure thereof is similar to that of FIG. 4, and only the main portion thereof is explained here. In the embodiment of FIG. 6, instead of generating the internal power source voltage which is lower than external power source voltage VP, a potential higher than power source voltage VP is applied to the gates of transistors TD1 to TDn acting as loads of column lines D1 to Dn and the drain voltage is set to be high. In this way, the cell transistor is operated in the pentode operation mode.

As shown in FIG. 6, a series circuit of depletion type MOS transistors T61 to T62 is connected between the gate of MOS transistor T1 and the terminal to which external power source voltage Vp is applied, and depletion type MOS transistor T60 having drain connected to receive stepped-up voltage VH generated from high voltage generation circuit 120 is connected in series with MOS transistor T62. The gates of MOS transistors T60 and T62, the source of MOS transistor T62 and the gate of MOS transistor T1 are connected to node N5 and inverter 150 is connected between the gates of MOS transistor T1 and depletion type MOS transistor T61. Node N5 is connected to the signal from internal data producer 62 in FIG. 4.

With the circuit of this construction, since voltage VH is set to a high level of (Vp+α) in the programming mode, if node N5 is high level by the signal from the internal data producer 62 in FIG. 4, MOS transistors T60 and T62 are turned on and MOS transistor T61 is turned off, thus causing high voltage VH (=Vp+α) to be applied to the gate of MOS transistor T1. If node N5 is low level, MOS transistor T60 is turned off and MOS transistor T61 is turned on. In contrast, in the readout mode, node N5 is normally low level, MOS transistor T1 is turned off.

Likewise, a series circuit of depletion type MOS transistors T66 and T67 is connected between the gate of MOS transistor TD1 to and the terminal to which external power source voltage Vp is applied, and depletion type MOS transistor T65 having a drain connected to receive stepped-up voltage VH generated from high voltage generation circuit 120 is connected in series with MOS transistor T67. The gates of MOS transistors T65 and T67 are connected to the gate of MOS transistor TD1, and inverter 160 is connected between the gates of MOS transistor TD1 and depletion type MOS transistor T66.

With the circuit of this construction, since voltage VH is set to a high level of (Vp+α) in the programming mode, when Cl is selected by the column decoder 1 and high level, MOS transistors T65 and T67 are turned on and MOS transistor T66 is turned off, thus causing high voltage VH (=Vp+Δ) to be applied to the gate of MOS transistor TD1. In contrast, when Cl is deselected and low level, MOS transistor T65 is turned off and MOS transistor T66 is turned on.

In the programming mode, internal power source voltage VP is applied to the control gate and voltage VH is applied to the gates of MOS transistors T1 and TD1. Assume that the threshold voltage Vth of each of MOS transistors T1 and TD1 is 3 V. Then, if stepped-up voltage VH is set to be higher than 24 V (VP+Vth =21V+3V=24 V), a drain voltage of approx. 18 V can be applied to the drain of memory cells TM11 to TMmn. In this case, even if control gate voltage Vcg is 21 V as dsscribed before, floating gate voltage Vfg is set to be 18 V so that the cell transistor can be operated in the pentode operation mode. In this embodiment, internal power source voltage VP' may be applied to the control gate and the cell transistor may be operated under a proper bias condition.

Further, in the above embodiment, the EEPROM cell is formed of a MOS transistor with the triple gate structure. However, this invention can be applied to an EEPROM cell having no erasing gate and in this case, the same effect as described before can be attained.

As described above, according to this invention, an electrically erasable non-volatile semiconductor memory device can be provided in which the MOS transistor constituting the EEPROM cell can be operated in the pentode operation mode in the programming mode, thus attaining a good programming characteristic.

What is claimed is:

1. A non-volatile semiconductor memory device comprising:
   a row decoder;
   a column decoder;
   a plurality of row lines;
   a plurality of column lines;
   a plurality of column selection lines selected by said column decoder, said column selection lines being coupled to said column lines in such a way that a selected column selection line selects the corresponding column line;
   a memory cell array including a plurality of non-volatile semiconductor memory cells connected between said row lines and said column lines in a matrix array, each of the memory cells including a floating gate, electrons being excessively discharged from the floating gate so that the floating gate is positively charged when data is erased from the cell in an erasing mode;
   means for applying a first voltage having a first voltage level to the column selection lines in a data writing mode; and
   means for applying a second voltage having a second voltage level to the row lines in a data writing mode, the second voltage level being lower than the first voltage level.

2. A non-volatile semiconductor memory device according to claim 1, wherein
   each of said memory cells further comprises an erasing gate to which a third voltage is applied in the erasing mode.

3. A non-volatile semiconductor memory device comprising:
   a row decoder;
   a column decoder;
   a plurality of row lines;
   a plurality of column lines;
   a plurality of column selection lines selected by said column decoder, said column selection lines being coupled to said column lines in such a way that a selected column selection line selects the corresponding column line;
   a memory cell array including a plurality of non-volatile semiconductor memory cells connected between said row lines and said column lines in a matrix array;
   means for applying a first voltage having a first voltage level to the column selection lines in a data writing mode; and
   means for applying a second voltage having a second voltage level to the row lines in a data writing mode, the first voltage level being set to a predetermined level higher than a programming voltage of an external power source, the second voltage level being set to a predetermined level lower than that of the programming voltage of the external power source.

4. A non-volatile semiconductor memory device according to claim 3, wherein
   each of said memory cells further comprises an erasing gate to which a third voltage is applied in an erasing mode.

5. A non-volatile semiconductor memory device comprising:
   a row decoder;
   a column decoder;
   a plurality of row lines selected by said row decoder;
   a plurality of column lines selected by said column decoder;
   a memory cell array including a plurality of non-volatile semiconductor memory cells each having a source, drain, control gate, insulating film and floating gate buried in the insulating film, data being stored in the memory cell by injecting charges through the insulating film into the floating gate, said memory cells being arranged in a matrix array, the control gates of the memory cells being connected to the corresponding row lines, respectively and the drains of the memory cells being connected to the column lines, respectively;
   means for applying a first level voltage to the column lines in a data writing mode; and
   means for applying a second level voltage to the row lines in a data writing mode, the second level voltage being set to have a predetermined level lower than that of the first level voltage.

6. A non-volatile semiconductor memory device according to claim 5, wherein; and
   each of said memory cells further comprising an erasing gate buried in the insulating film, to which a third voltage is applied in an erasing mode.

7. A non-volatile semiconductor memory device comprising:
   a plurality of row and column lines;
   a memory cell array including a plurality of non-volatile semiconductor memory cells each having a predetermined threshold voltage and a semiconductor structure including a source, drain, control gate, insulating film and floating gate buried in the insulating film, data being stored in the memory cell by injecting charges through the insulating film into the floating gate, said memory cells being arranged in a matrix array, the control gates of the memory cells being connected to the corresponding row lines, respectively, the drains of the memory cells being connected to the column lines, respectively, and the floating gates being maintained at a floating gate potential after data is erased from the memory cells;
   means for applying a first voltage to the column lines in a data writing mode so that the drains of the memory cells are maintained at a drain potential, the sum level of the drain potential and the threshold voltage being not smaller than the floating gate potential; and
   means for applying a second voltage to the row lines in the data writing mode.

8. A non-volatile semiconductor memory device according to claim 7, wherein; and
   each of said memory cells further comprising an erasing gate buried in the insulating film, to which a third voltage is applied in an erasing mode.

9. A non-volatile semiconductor memory device comprising:
   a row decoder;
   a column decoder;
   a plurality of column lines;

a plurality of column selection lines selected by said column decoder, said column selection lines being coupled to said column lines in such a way that a selected column selection line selects the corresponding column line;

a memory cell array including a plurality of non-volatile semiconductor memory cells connected between said row lines and said column lines in a matrix array;

means for applying a first voltage having a first voltage level to the column selection lines in a data writing mode; and means for applying a second voltage having a second voltage level to the row lines in a data writing mode, the first voltage level being set to a programming voltage by an external power source, and the second voltage level being set to a predetermined level lower than the first voltage level;

wherein said second voltage applying means includes a converting circuit for converting said programming voltage to the second voltage level, said converting circuit including a first MOS transistor, having a drain connected to the external power source, a source connected to the second voltage level, a second MOS transistor having a drain connected to the external power source and a gate of the first MOS transistor, a gate connected to the second voltage level, resistor means connected in series between the external power source and ground, and a source of the second MOS transistor connected to a connecting node of the resistor means.

10. A non-volatile semiconductor memory device comprising:
a row decoder;
a column decoder;
a plurality of row lines;
a plurality of column lines;
a plurality of column selection lines selected by said column decoder, said column selection lines being coupled to said column lines in such a way that a selected column selection line selects the corresponding column line;

a memory cell array including a plurality of non-volatile semiconductor memory cells connected between said row lines and said column lines in a matrix array;

means for applying a first voltage level to the column selection lines in a data writing mode; and means for applyikng a second voltage level to the row lines in a data writing mode, the first voltage level being set to a predetermined level higher than a programming voltage of an external power source, the second voltage level being set to a predetermined level lower than that of the programming voltage of the external power source;

wherein said second voltage applying means includes a converting circuit for converting the programming voltage of the external power source to the second voltage, said converting circuit including a MOS transistor having a drain connected to the external power source, a source connected to the second voltage level, resistor means connected in series between the external power source and gorund, and a gate of the MOS transistor connected to a connecting node of the resistor means.

* * * * *

UNITED STATES PATENT AND TRADEMARK OFFICE
CERTIFICATE OF CORRECTION

PATENT NO. : 4,979,146
DATED : December 18, 1990
INVENTOR(S) : Sadayuki Yokoyama, et al It is certified that error appears in the above-identified patent and that said Letters Patent is hereby corrected as shown below:

On the Title page:
Abstract, line 4, after "Up" delete [at].

Claim 6, column 10, line 29, after "wherein" delete [;and].

Claim 8, column 10, line 60, after "wherein" delete [; and].

Claim 9, column 10, between lines 67 and 68, insert
--a plurality of row lines--.

Claim 10, column 12, line 18, change "applyikng"
to --applying--.

UNITED STATES PATENT AND TRADEMARK OFFICE
CERTIFICATE OF CORRECTION

PATENT NO. : 4,979,146
DATED : December 18, 1990
INVENTOR(S) : Sadayuki Yokoyama, et al It is certified that error appears in the above-indentified patent and that said Letters Patent is hereby corrected as shown below:

Claim 10, column 12, line 32-33, change "gorund" to --ground--.

Signed and Sealed this

Second Day of November, 1993

Attest:

BRUCE LEHMAN

Attesting Officer

Commissioner of Patents and Trademarks